United States Patent [19]

Ohashi et al.

[11] Patent Number: 4,908,633

[45] Date of Patent: Mar. 13, 1990

[54] PHOTOSENSITIVE MICROCAPSULE RECORDER WITH TRANSFER SHEET TRANSPORTED AT AN ANGLE RELATIVE TO THE AXIAL DIRECTION OF THE PRESSURE ROLLERS

[75] Inventors: Kunio Ohashi; Syoichi Nagata, both of Nara, Japan

[73] Assignee: Sharp Kabushiki Kaisha, Osaka, Japan

[21] Appl. No.: 291,180

[22] Filed: Dec. 28, 1988

[30] Foreign Application Priority Data

Dec. 28, 1987 [JP] Japan .............................. 62-333105
Jan. 14, 1988 [JP] Japan .................................. 63-6676

[51] Int. Cl.$^4$ ...................... G03B 27/52; G01D 9/42; G03C 1/72
[52] U.S. Cl. ................................. 346/107 R; 355/27; 355/295; 430/138; 354/304
[58] Field of Search ............. 346/107 R; 355/27, 295; 271/226; 354/304; 430/138; 100/144, 155, 173, 176

[56] References Cited

U.S. PATENT DOCUMENTS 4,789,877 12/1988 Izaki .................................. 355/295

Primary Examiner—B. A. Reynolds
Assistant Examiner—Scott A. Rogers
Attorney, Agent, or Firm—Flehr, Hohbach, Test, Albritton & Herbert

[57] ABSTRACT

An image forming apparatus makes use of a photosensitive sheet having a surface coated with microcapsules encapsulating a light-curable agent and a colorless dye and an image transfer sheet having one surface coated with a developing agent having an chromogenic effect on the encapsulated colorless dye. When these sheets are superposed one on top of the other and transported to and pressed together between a pair of pressure rollers, the image transfer sheet is transported to the pressure rollers by making an angle greater than 0.5° with the axial direction of these rollers.

7 Claims, 6 Drawing Sheets

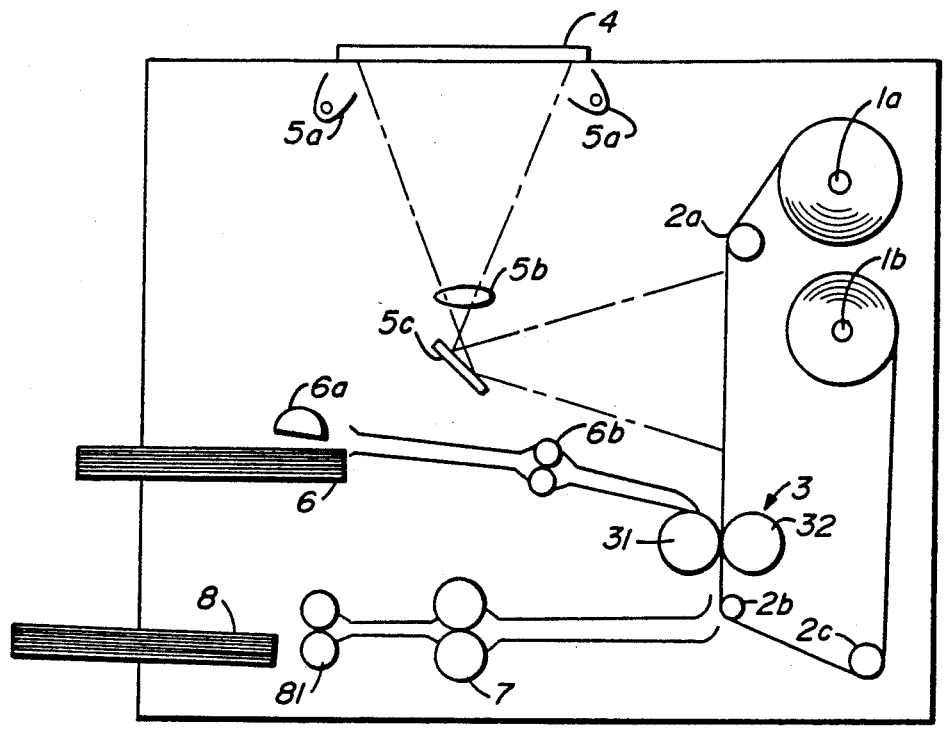
FIG._1
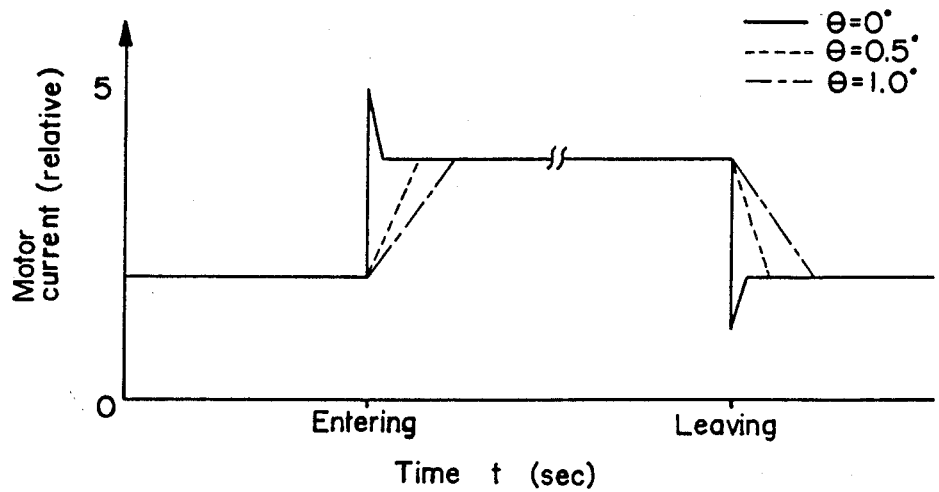
FIG._5

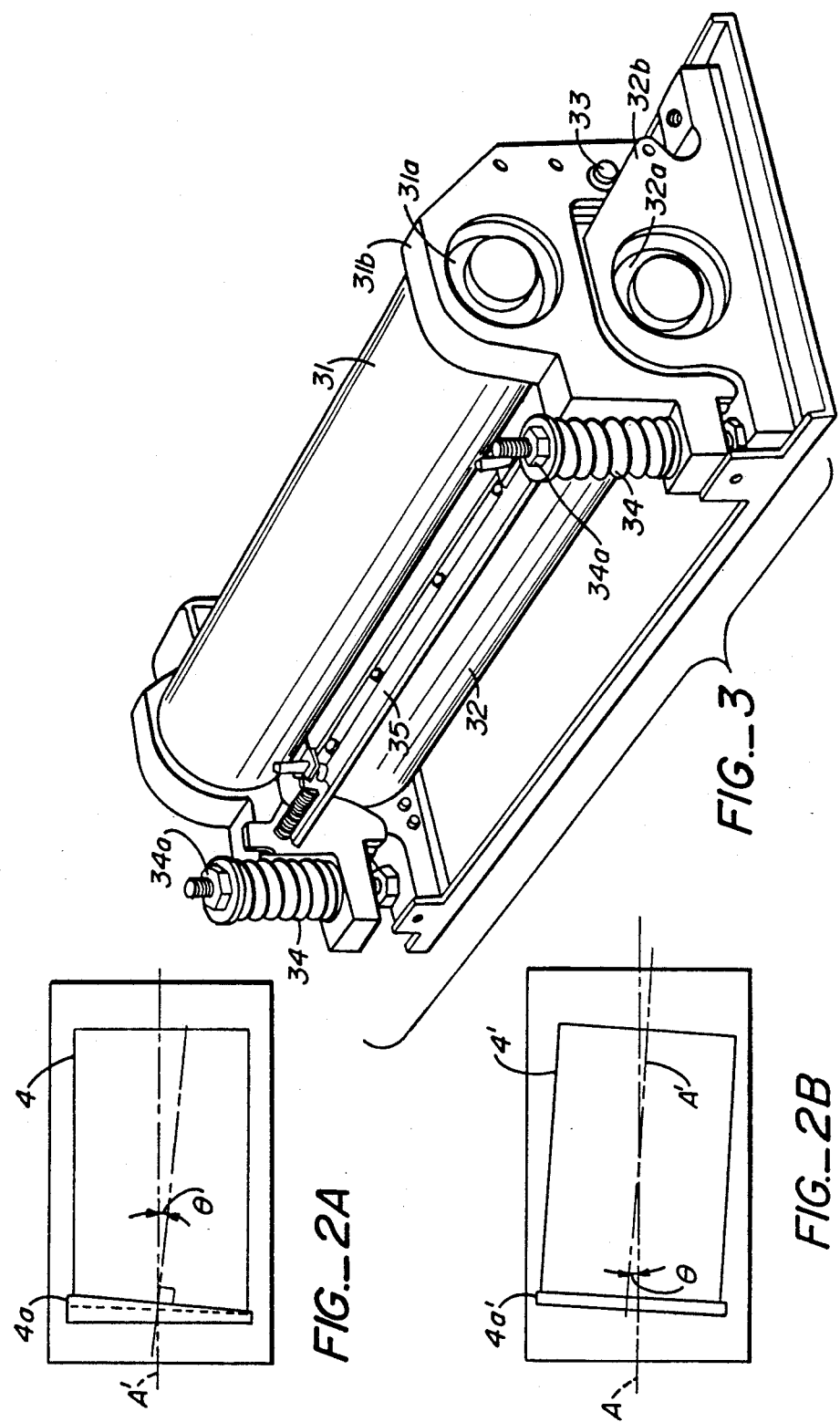

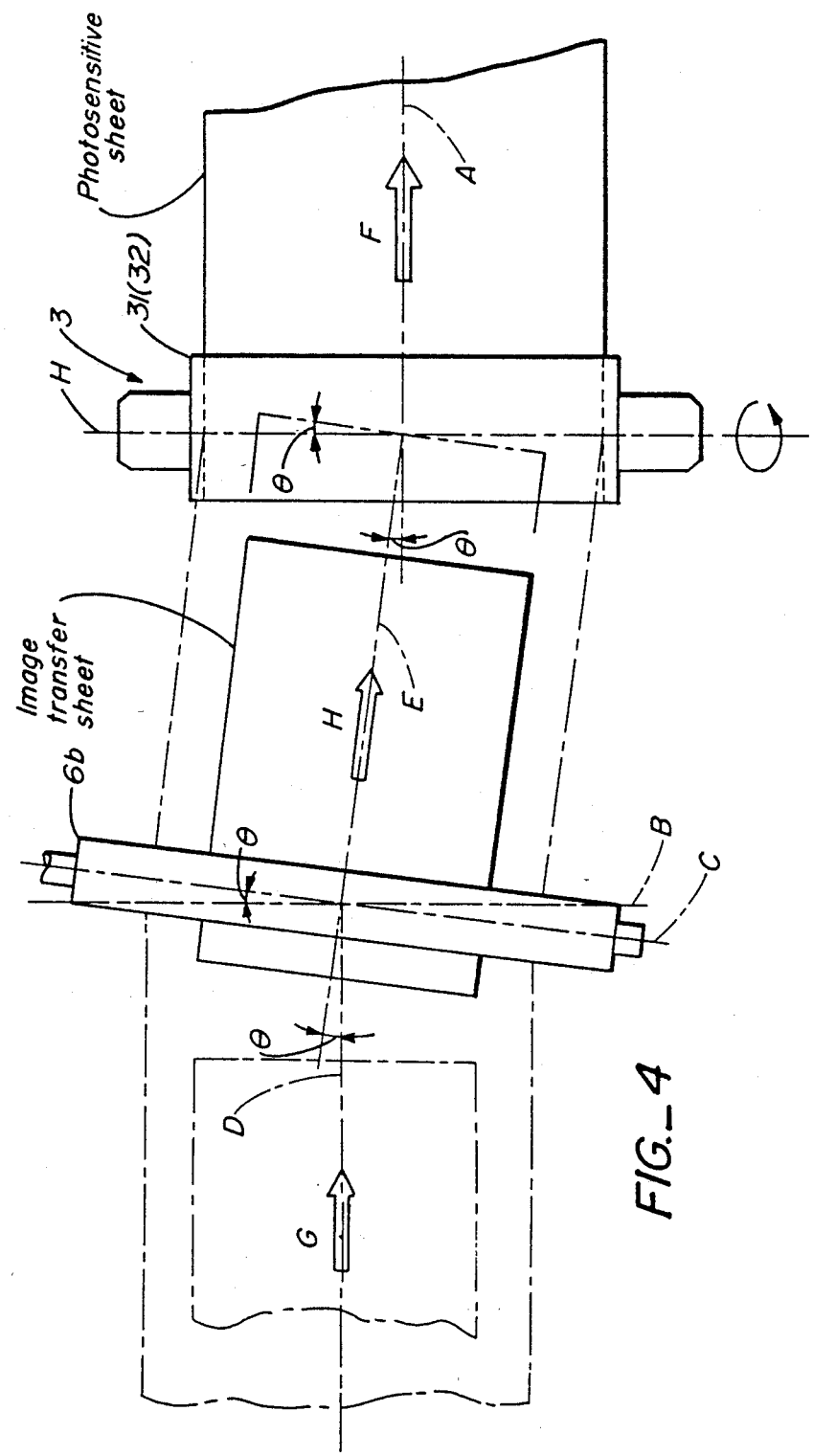
FIG._4

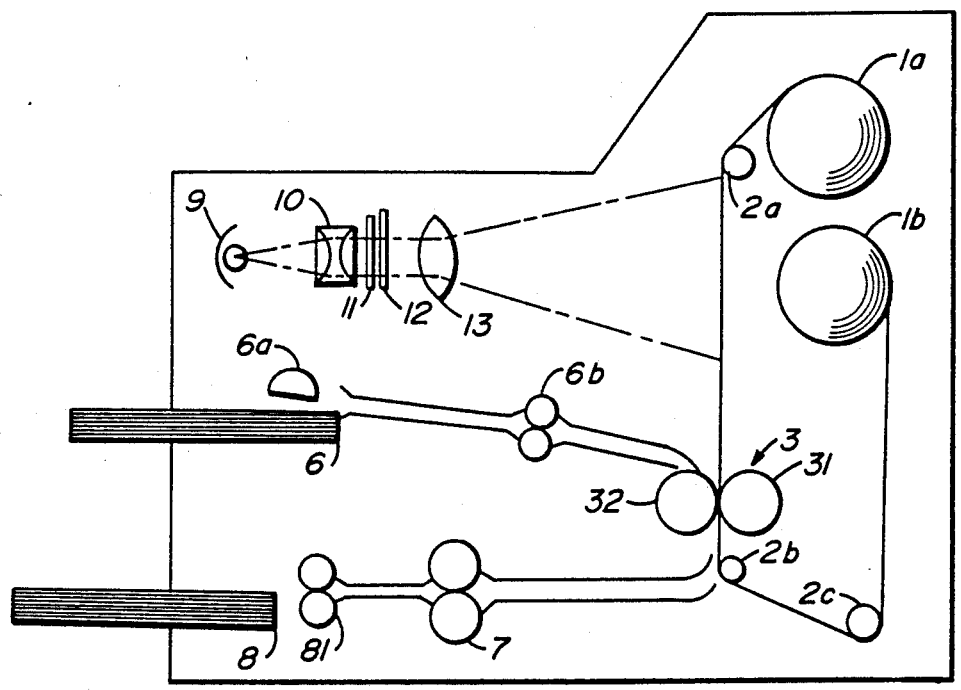
FIG._6
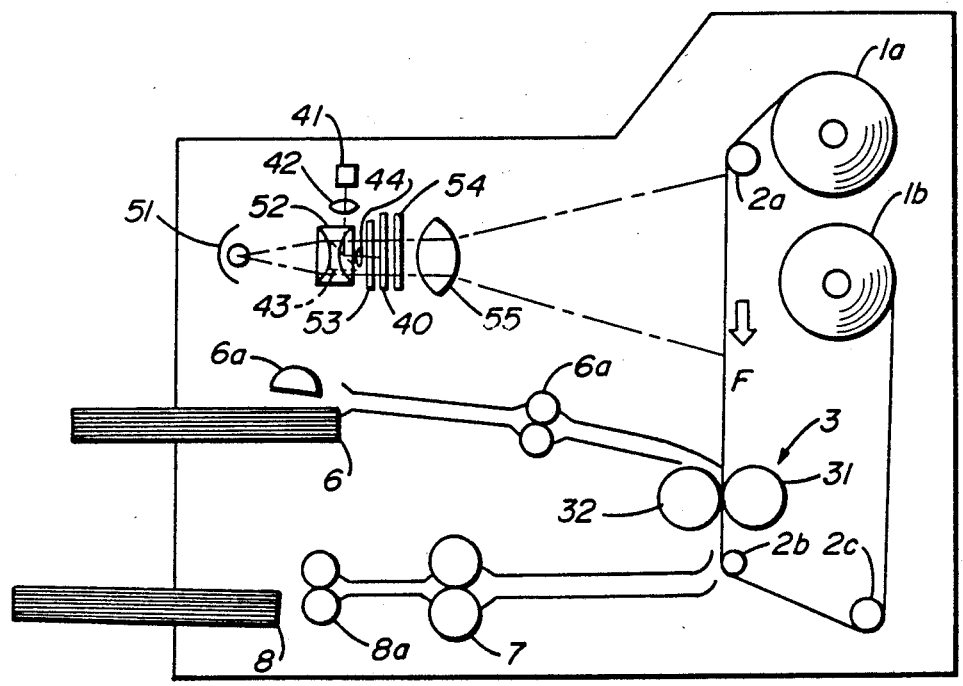
FIG._8

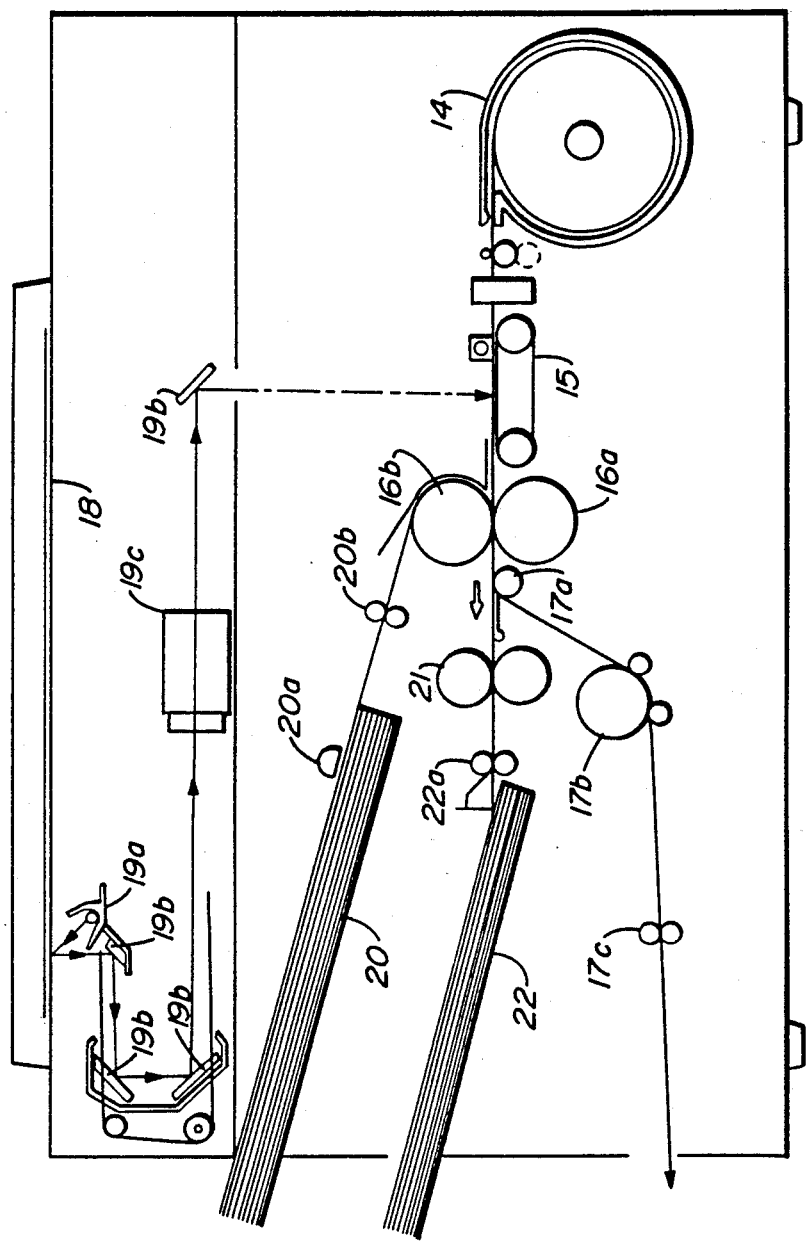
FIG._7

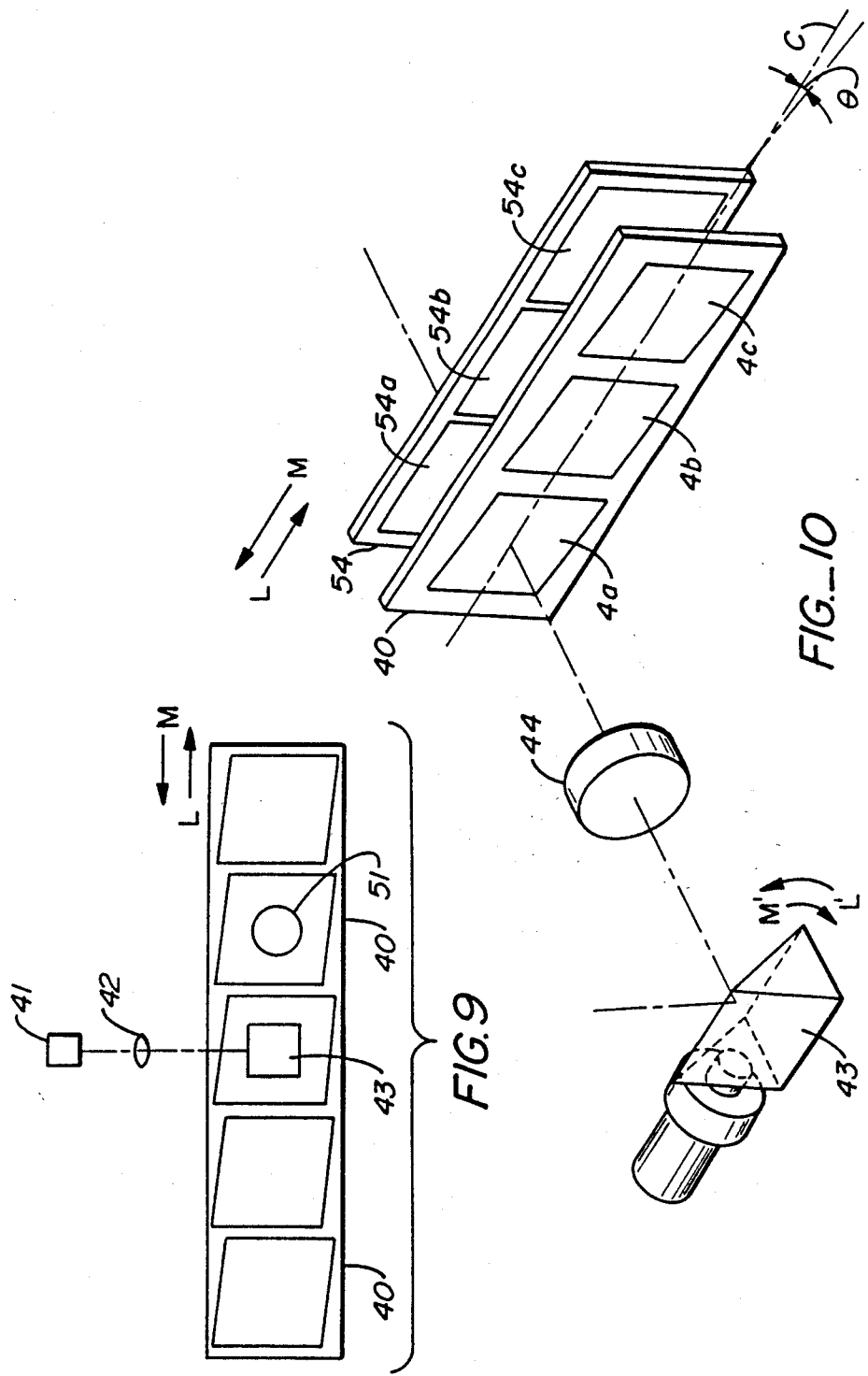

PHOTOSENSITIVE MICROCAPSULE RECORDER WITH TRANSFER SHEET TRANSPORTED AT AN ANGLE RELATIVE TO THE AXIAL DIRECTION OF THE PRESSURE ROLLERS

BACKGROUND OF THE INVENTION

This invention relates to an image forming apparatus which forms images by superposing a photosensitive sheet with one surface coated with microcapsules encapsulating a colorless dye and a light-curable agent which hardens by exposure to light and an image transfer sheet with one surface coated with a developing agent having a chromogenic effect on this colorless dye and pressing them together.

Japanese Patent Publication Tokkai 58-88739 discloses a method of forming images by using a photosensitive sheet. The photosensitive sheet used by this method is characterized as having a sheet-like light-transmissive base material coated with microcapsules encapsulating a colorless dye of a specified kind and a light-curable agent which hardens when exposed to light. If a photosensitive sheet like this is exposed to image-forming light such as reflected light from a document, only those of the microcapsules on the sheet which are exposed to light are hardened and a latent image corresponding to the image carried by the light is thereby formed on the photosensitive sheet. If an image transfer sheet with one surface coated with a developing agent having a chromogenic effect on the colorless dye in the microcapsules is superposed on such a photosensitive sheet having a latent image formed thereon and if they are then pressed together, those of the microcapsules which have not been hardened rupture, causing the colorless dye encapsulated therein to flow out thereof and to react with the developing agent on the image transfer sheet to form a visible image corresponding to the latent image.

Examples of technologies for exposing a photosensitive sheet to image-forming light include the use of a liquid crystal panel in which an image has been formed. If light is made incident on such a panel and the photosensitive sheet is exposed to the transmitted or reflected light, a latent image can be formed as explained above by the hardened microcapsules. It is known that an image containing a large amount of information can be formed over a small area by using heat of a laser beam on an element such as a smectic liquid crystal panel in which image can be formed by an electro-thermo-optic effect. It is advantageous to make use of such a smectic liquid crystal panel with a small surface area to expose a photosensitive sheet to an image-forming beam of light because, unlike by prior art methods of exposure through a slit, the entire image on the liquid crystal panel can be projected onto the photosensitive sheet by means of a small optical system and it is possible to thereby speed up the process of forming images.

In order to rupture the microcapsules which have not been hardened on a photosensitive sheet described above, a high pressure on the order of 25-125 kg/cm is required and use is usually made of a compressing device with a pair of pressure rollers for applying such a high pressure. Such compression devices have been disclosed, for example, in U.S. Pat. No. 4,399,209 and Japanese Patent Publication Tokkai 62-6257.

Inconveniences are often encountered with image forming apparatus having such a compression device with a pair of pressure rollers because the rotations of the individual rollers may change suddenly when the front edge of an image transfer sheet (with thickness of 60–150μm) superposing a photosensitive sheet is sent between the lines of contact on these rollers and when its back edge leaves the gap therebetween. Such sudden changes in the rotations of the rollers not only make the speed of feeding the image transfer sheet unstable but also cause vibrations in the optical system and the paper feeding system for the image transfer sheet, thereby adversely affecting the quality of the formed images with distortions and blurriness. There is also the problem of noise when an image transfer sheet enters or comes out of the gap between the pressure rollers. The noise of impact is particularly loud when an image transfer sheet is transported out of the gap.

Still more importantly, sudden changes in the rotations of the rollers tend to shorten the lifetimes of the various parts for driving the rollers such as gears and clutches. In order to prevent their lifetimes from becoming shortened, they must be either made of a stronger material or structurally so designed as to withstand changes in rotations. If such parts are used, however, use must also be made of a motor with a high output torque at the startup and this has the adverse effect of increasing the overall cost of the apparatus as well as its weight.

SUMMARY OF THE INVENTION

It is therefore an object of the present invention to provide an improved image forming apparatus with which the problems described above can be eliminated.

An image forming apparatus embodying the present invention is characterized not only as forming images by superposing a photosensitive sheet with one surface coated with microcapsules encapsulating a light-curable material and a colorless dye with an image transfer sheet with one surface coated with a developing agent having a chromogenic effect on the colorless dye and by rupturing those of the unhardened microcapsules by pressing them together between pressure rollers which form a pair but also in that the image transfer sheet is delivered to the pressure rollers at an angle larger than 0.5° with the axes of these rollers.

According to a preferred embodiment of the present invention, the image forming apparatus further comprises timing rollers at which the image transfer sheet is temporarily stopped before it is further transported thereby towards the pressure rollers.

According to another preferred embodiment of the present invention, the axes of the timing rollers make a specified angle with the axial direction of the pressure rollers.

According to still another preferred embodiment of the present invention, the image forming apparatus further comprises an optical system adapted to form an image on the photosensitive sheet at the same angle as the angle between the image transfer sheet and the pressure rollers.

According to still another preferred embodiment of the present invention, the aforementioned optical system serves to form an image on a photosensitive sheet from a pictorial image written in a cell electro-thermo-optically by laser heating.

According to still another preferred embodiment of the present invention, the image forming apparatus includes means for writing an image in such a cell by laser heating.

According to still another preferred embodiment of the present invention, a smectic liquid crystal panel is used for writing an image by laser heating.

With an image forming apparatus embodying the present invention, an image transfer sheet is nipped between the pressure rollers gradually from one side of its front edge and, when it is released therefrom, the area of the transfer sheet nipped between the pressure rollers decreases gradually until one side of its back edge leaves the gap such that the pressure change on the pressure rollers is not sudden and there is no impinging sound or rapid changes in rotations of the rollers. As a result, the optical system and the transportation system for the transfer sheets do not vibrate and no distortions or blurriness appears in the image. Moreover, since the shock experienced by the driving components such as gears, chains, belts and clutches is reduced, the lifetimes of these components can be significantly improved and since no particularly sturdy material need be used for these components, the apparatus can be compactly and economically designed. Since the latent image is formed at an angle with respect to the photosensitive sheet, a visible image is correctly obtained on an image transfer sheet which is delivered at the same angle with respect to the pressure rollers.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a schematic front sectional view of a copier according to a first embodiment of the present invention to approximately show its structure, FIG. 2A is a plan view of its document table and FIG. 2B is a plan view of another document table embodying the present invention, FIG. 3 is a diagonal view of a compression device, FIG. 4 is a drawing for explaining the positional relationship between the pressure rollers and the timing rollers, FIG. 5 is a graph showing the relationship between the angle of the image transfer sheet and the motor driving current for the pressure rollers of FIG. 1, FIG. 6 is a schematic front sectional view of another copier according to a second embodiment of the present invention to approximately show its structure, FIG. 7 is a schematic front sectional view of still another copier according to a third embodiment of the present invention to approximately show its structure, FIG. 8 is a schematic front sectional view of still another copier according to a fourth embodiment of the present invention to approximately show its structure, FIG. 9 is a front view of the optical system of the copier of FIG. 8, and FIG. 10 is a diagonal view of the image writing section of the optical system of FIG. 9.

In all these figures, components which are substantially identical are indicated by the same numerals and not explained separately.

DESCRIPTION OF PREFERRED EMBODIMENTS

With reference to FIG. 1 which schematically shows a stationary exposure type copier serving as a first embodiment of the present invention, a photosensitive sheet in the form of a roll is mounted onto a supporting roller 1a at one side section of its housing structure. One end of the photosensitive sheet is pulled from the supporting roller 1a and, after passing by a guide roller 2a, between a pair of pressure rollers 31 and 32 of a compression device 3 and around guide rollers 2b and 2c, is wound up by a take-up roller 1b. The photosensitive sheet has one surface coated with microcapsules encapsulating a colorless dye and a light-curable agent which hardens by exposure to light and is transported with this microcapsule-coated surface facing outwardly. A document table 4 made of a light-transmissive material such as transparent glass is provided at the upper surface of the housing structure for placing thereon an original document to be copied.

Provided below the document table 4 is an optical system including a pair of light sources 5a, a lens 5b and a mirror 5c and serving to expose the document on the document table 4 to light and to lead the reflected light therefrom to the microcapsule-coated surface of the photosensitive sheet before it reaches the compression device 3. The light-curable agent inside the exposed microcapsules is hardened and a latent image is thus formed on the photosensitive sheet by the selectively hardened microcapsules exposed to the image-forming light from the document.

At one side section of the housing structure opposite from the supporting roller 1a is a paper supply cassette 6 containing image transfer sheets therein. These image transfer sheets have one surface coated with a developing agent having a chromogenic effect on the colorless dye encapsulated in the microcapsules on the photosensitive sheet. These image transfer sheets are transported out of the cassette 6 one sheet at a time by means of a feeder roller 6a. Each image transfer sheet is temporarily stopped at the position of timing rollers 6b and then delivered to the compression device 3 by the rotary motion of the timing rollers 6b according to a specified timing schedule. The compression device 3 is comprised of a pair of pressure rollers 31 and 32 such that the photosensitive sheet and an incoming image transfer sheet are superposed one on top of the other to pass between these pressure rollers 31 and 32. While these sheets pass between the pressure rollers 31 and 2, the unhardened microcapsules on the photosensitive sheet rupture and the colorless dye flows out of these ruptured microcapsules. When the colorless dye comes into contact with the coated surface of the image transfer sheet, it reacts chromogenically with the developing agent thereon. After passing between the pressure rollers 31 and 32, the image transfer sheet is separated from the photosensitive sheet and led to the heat roller 7 by which it is heated such that the chromogenic reaction on its surface is accelerated. The image transfer sheet is thereafter discharged onto a discharge tray 8 by means of discharge rollers 81.

As shown in FIG. 2A, the document table 4 is rectangular and its entire surface can be projected by the lens 5b, the mirror 5c, etc. onto the microcapsule-coated surface of the photosensitive sheet pulled out of the supporting roller 1a to be delivered to the compression device 3 with its direction of motion coinciding with one of the sides of the document table 4. In FIG. 2A, A' indicates the center line bisecting the document table 4 longitudinally. This center line coincides with the center line for the transportation of the photosensitive sheet when the photosensitive sheet is exposed. A positioning piece 4a is provided on one side of the document table 4 (on the upstream side along the direction of travel of the photosensitive sheet). This positioning piece 4a has a reference surface perpendicular to a line segment making a specified angle θ greater than about 0.5° from the center line A' of the document table 4. When a document to be copied is placed on top of the document table 4, one side of the document is pressed against this reference surface. Thus, the document to be copied then makes the specified angle θ with the document table 4 and the image of the document projected onto the photosensitive sheet also makes an angle of θ with the center line of transportation on the microcapsule-coated surface. As a result, a latent image is formed on the photosensitive sheet tilted by the specified angle θ from the center line of transportation.

Alternatively, a document table 4', as shown in FIG. 2B, may be so formed that its center line A' makes a specified angle θ from the center line A of transportation of the photosensitive sheet. In such a case, a positioning piece 4a' is provided with a reference surface which is parallel to one side of the document table 4' as is the case with the positioning piece for the document table of an ordinary image forming apparatus.

The compression device 3 is comprised, as shown in FIG. 3, of a fixed pressure roller 32 attached to a base and a mobile pressure roller 31 which forms a pair with the fixed pressure roller 32, each of the pressure rollers 31 and 32 being rotatably supported axially through bearings 31a or 32a by a roller holder 31b or 32b. The two roller holders 31b and 32b are supported rotatably around a shaft 33 and are connected by a pair of adjusting nuts 34a with pressuring springs 34 externally engaged therearound. With the roller holders 31b and 32b thus connected, the mobile pressure roller 31 serves, like a lever, to press against the fixed pressure roller 32 across their contact point, the shaft 33 serving as the fulcrum, the contact point as the point of action and the springs 34 as points of force. The force to be applied can be adjusted by tightening or loosening the adjusting nuts 34a. Numeral 35 indicates a scraper provided to the mobile roller holder 31b for removing the photosensitive and image transfer sheets easily from the mobile pressure roller 31. The fixed roller 32 is provided with a sprocket (not shown) connected to a driving means through a chain.

With reference to FIG. 4 which is presented for the purpose of explaining the positional relationship between the timing rollers 6b and the pressure rollers 31 and 32 of the compression device 3, the timing rollers 6b serve to temporarily stop an image transfer sheet delivered from the paper cassette 6 and to thereafter deliver the sheet to the compression device 3 in synchronism with the delivery of the photosensitive sheet. The photosensitive sheet with a latent image formed thereon by image-forming light is transported into the gap between the pressure rollers 31 and 32 of the compression device 3 and, after passing therethrough, is guided in the direction shown by the arrow F. The center line D of transportation for the image transfer sheet from the cassette 6 to the timing rollers 6b along the arrow G does not coincide with the center line of transportation of the photosensitive sheet. The axial direction C of the timing rollers 6b is moved by a specified angle θ towards the compression device 3 from a perpendicular line to the center line D of transportation for the image transfer sheet. This specified angle θ is the same as the angle by which a document to be copied is tilted with respect to the document table 4 when positioned with reference to the positioning piece 4a as explained above.

The image transfer sheet, which has been delivered to the position of the timing rollers 6b, is temporarily stopped thereby upon coming into contact therewith. Since the timing rollers 6b are disposed at the specified angle θ with the center line D of transportation for the image transfer sheet, the transfer sheet which is stopped by the timing rollers 6b comes to make the angle θ with the center line D. When the timing rollers 6b begin to rotate thereafter with the transfer sheet positioned as explained above, the image transfer sheet begins to travel along the arrow H perpendicularly to the axial direction C of the timing rollers 6b. The center line E of transportation for the image transfer sheet in the direction of the arrow H by the operation of the timing rollers 6b makes the same specified angle θ both with the center line D of transportation for the image transfer sheet before it is delivered to the timing rollers 6b and with the center line A of transportation for the photosensitive sheet, crossing with the center line A of transportation for the photosensitive sheet on the contact line between the two pressure rollers 31 and 32. Thus, when an image transfer sheet is transported to the contact line between the pressure rollers 31 and 32, its center line E of transportation makes the specified angle θ with the center line A of transportation of the photosensitive sheet. As explained above, a latent image is formed on the microcapsule-coated surface of the photosensitive sheet by making an angle of θ with the center line A of its transportation. In other words, both the latent image formed on the photosensitive sheet and the image transfer sheet transported to the position of the pressure rollers 31 and 32 are tilted by the same specified angle θ with respect to the center line A of transportation for the photosensitive sheet as these sheets are superposed there one on top of the other.

As the photosensitive and image transfer sheets are thus superposed one on top of the other and together sent between the pressure rollers 31 and 32, they are pressed together between these rollers 31 and 32 and those of the microcapsules on the photosensitive sheet which have not been hardened rupture, causing the colorless dye contained therein to flow out thereof to react chromogenically with the developing agent on the image transfer sheet and thereby forming a visible image which is not tilted with respect to the image transfer sheet.

The image transfer sheet, after passing between the pressure rollers 31 and 32, is separated from the photosensitive sheet by means of a scraper 35, heated by a heat roller 7 and discharged into a discharge tray 8 by means of discharge rollers 81. On the image transfer sheet with a visible image formed by the colorless dye and the developing agent, the chromogenic reaction is accelerated by the heat from the heating roller 7 to form a clear image as disclosed, for example, in Japanese Patent Publication Tokkai 61-24495. If the image transfer sheet is coated with a thermoplastic material, furthermore, a lustrous image can be obtained by the heating as disclosed, for example, in Japanese Patent Publication Tokkai 60-259490.

After passing between the pressure rollers 31 and 32 and separated from the image transfer sheet, the photosensitive sheet is transported by the guide rollers 2b and 2c and wound up by the take-up roller 1b.

With a copier thus structured, the tilting angle θ of the timing rollers 6b was varied to adjustingly change the angle θ of incidence of the image transfer sheet being transported to the pressure rollers 31 and 32 and the corresponding change in the current through the motor for the pressure rollers 31 and 32 was measured. In this experiment, the original document to be copied was also tilted from the document table 4 by the same angle by which the timing rollers 6b were tilted. The angle of the document with respect to the document table 4 was varied by changing the angle of the reference surface of the positioning piece 4a on the document table 4. FIG. 5 is a graph which shows the results of this series of experiments, its horizontal axis representing time (as the image transfer sheet is transported) and the vertical axis representing the current through the pressure rollers 31 and 32. For the experiment, use was made of a condenser-run AC motor and the speed of travel of the image transfer sheet was set to 5 mm/sec.

As can be understood from this graph, the current through the motor changes suddenly and the rotations of the pressure rollers 31 and 32 vary rapidly when the image transfer sheet enters or leaves the gap between the pressure rollers 31 and 32 if the angle $\theta$ of the image transfer sheet entering the gap is 0°, or if the front edge of the incoming image transfer sheet is parallel to the axial direction of the pressure rollers 31 and 32. In this situation, there were distortions and blurriness of images due to the changes in the rotations of the pressure rollers 31 and 32 and the vibrations of the optical system and the transportation system for image transfer sheets. There was also a noise in this situation as an image transfer sheet entered and left the gap between the pressure rollers 31 and 32. The noise was particularly loud when an image transfer sheet was leaving the gap.

If the angle $\theta$ by which an image transfer sheet enters the gap between the pressure rollers 31 and 32 was increased to 0.5° or 1.0°, by contrast, there was no sudden change in the current through the motor for the pressure rollers 31 and 32 and there was hardly any occurrence of a rapid change in the rotations of the pressure rollers 31 and 32 or a loud noise as an image transfer sheet entered or left the gap therebetween. As a result, there were hardly any vibrations of the optical system or the transportation system for image transfer sheets. There was no occurrence of distortions or blurriness in the image and it was possible to obtain images of extremely high quality.

Although the speed of travel for the image transfer sheet was 5 mm/sec for the experiment shown in FIG. 5, the sudden changes in the rotations of the pressure rollers can be reduced, even if the speed of travel of the image transfer sheet is increased, by correspondingly increasing the angle $\theta$ of the image transfer being brought between the pressure rollers. According to the experiments by the present inventors, generation of a noise and occurrence of image distortions and blurriness can be practically entirely eliminated by setting the angle $\theta$ to 0.5° or larger if the speed of travel of the image transfer sheet is 150 mm/sec or less. If the angle of the image transfer sheet with respect to the pressure rollers is made too large, the axial extension of the pressure rollers must be increased and this requires the entire apparatus to become large. This further tends to make it impossible for the pressure rollers to uniformly apply a pressure in the longitudinal direction. From this point of view, it is preferable that the angle $\theta$ be no greater than about 40° and more preferable that it be less than about 30°.

Another copier of a static exposure type embodying the present invention is shown in FIG. 6. This copier is different from the one described above in that a reversal film is used to form images. More in detail, light from a light source 9 such as a halogen tungsten lamp is converged by a condenser lens 10 and projected onto a reversal film 12. Light transmitting through the reversal film 12 is directed by an image forming lens 13 onto a photosensitive sheet and focused on its microcapsule-coated surface, thereby selectively hardening the microcapsules on the photosensitive sheet to form a latent image thereon. Provided between this condenser lens 10 and the reversal film 12 is a shutter 11 which is opened only for a predetermined length of time to allow light to pass therethrough, depending on the photosensitivity characteristics of the light-curable agent encapsulated in the microcapsules coated on the photosensitive sheet.

In order to tilt the latent image on the photosensitive sheet by using this copier, as done with the copier described above by way of FIGS. 1-5, the reversal film 12 might simply be tilted from the direction of transportation of the photosensitive sheet within a plane parallel to the photosensitive sheet. Alternatively, the entire optical system may be tilted by the specified angle $\theta$. In this example, too, the image transfer sheet is transported by the timing rollers 6b to the pressure rollers 31 and 32 while being tilted by the specified angle $\theta$. With the coper thus structured, it is also possible to form an image without distortions on the image transfer sheet.

FIG. 7 shows a copier of a document scanning type. A photosensitive sheet in the form of a roll is contained inside a pull-out cassette 14 disposed at a side section of the copier housing structure. The photosensitive sheet is pulled out horizontally from this cassette 14, passed on top of a supporting table 15 and sent between a pair of pressure rollers 16a and 16b. The two pressure rollers 16a and 16b are disposed perpendicularly to the horizontal direction of travel of the photosensitive sheet which, after passing between the pressure rollers 16a and 16b, is led out of the housing structure by means of guiding rollers 17a, 17b and 17c. On the top surface of the housing structure is a document table 18 as shown at 4 or 4' in FIG. 2A or 2B. An original document to be copied is placed on the document table 18 at an angle $\theta$ with respect thereto. Below the document table 18 is an optical system comprising a light source 19a, mirrors 19b and a lens 19c. The document on the document table 18 is scanned by this optical system 19 and the reflected light is directed onto the photosensitive sheet on top of the supporting table 15. A latent image tilted by a specified angle $\theta$ with respect to its direction of motion is thereby formed on the microcapsule-coated surface of the photosensitive sheet. Opposite from the pull-out cassette 14 for the photosensitive sheet inside the housing structure, there is a paper cassette 20 containing image transfer sheets. These image transfer sheets are taken out of the cassette 20 one sheet at a time by means of a feeder roller 20a. The image transfer sheet, after taken out of the cassette 20, is temporarily stopped by timing rollers 20b and thereafter delivered to the pressure rollers 16a and 16b. As explained by way of FIG. 1, the timing rollers 20b are so disposed to be oriented at the same angle $\theta$ with respect to the direction of motion of the incoming image transfer sheet delivered thereto such that the image transfer sheet is transported by these timing rollers 20b to the pressure rollers 16a and 16b at the same angle $\theta$ with respect to the direction along which it was delivered to the timing rollers 20b. The pressure rollers 16a, and 16b are tilted by the angle $\theta$ with respect to the image transfer sheet transported from the timing rollers 20b such that the image transfer sheet is tilted by the angle θ as it is sent between the pressure rollers 16a and 16b.

The direction of motion of the photosensitive sheet between the pressure rollers 16a and 16b is perpendicular to these pressure rollers 16a and 16b such that the image transfer sheet is tilted with respect to the photosensitive sheet when they are superposed one on top of the other between the pressure rollers 16a and 16b. As a result, pressure is smoothly varied on the pressure rollers 16a and 16b as the image transfer sheet is sent into or delivered out of the gap between the pressure rollers 16a and 16b and there is no sudden change in the rotations of the pressure rollers or generation of a loud noise. The latent image formed on the photosensitive sheet and the image transfer sheet are matchingly superposed when microcapsules are ruptured by the pressure between the pressure rollers 16a and 16b. The image transfer sheet is thereafter separated from the photosensitive sheet and the photosensitive sheet is pulled out of the housing structure of the copier by guide rollers 17a, 17b and 17c while the image transfer sheet is heated by a heat roller 21 and discharged onto a discharge tray 22 by means of discharge rollers 22a. In summary, sudden changes in the rotations of pressure rollers and generation of loud noise can be eliminated and images of high quality can be obtained also with a copier of a document scanning type according to the present invention.

Although an example has been described above wherein the timing rollers are tilted because the image transfer sheet is transported at an angle to the pressure rollers, this is not intended to limit the present invention. Alternatively, a stopping plate may be provided instead of timing rollers to stop incoming image transfer sheets at a specified angle. The paper supply cassette containing the image transfer sheets itself may be mounted to the copier housing structure at an angle. A positioning member may be provided such that the image transfer sheets contained inside the cassette become oriented at an angle. Conical rollers may be used as timing rollers such that the image transfer sheet is transported at different speeds, depending on the position in the perpendicular direction to its motion and it is tilted when transported to the pressure rollers.

Although a mechanism was shown as an example whereby the image transfer sheet is transported at an angle with respect to the axial direction of the pressure rollers, furthermore, neither is it intended to limit the scope of the invention. Alternatively, the pressure rollers may be initially set at the specified angle θ with respect to the incoming direction of the image transfer sheet such that the image transfer sheet is relatively tilted by the angle θ from the pressure rollers. In such a situation, however, the latent image must be formed at the same angle with respect to the direction of motion of the photosensitive sheet.

FIG. 8 shows still another copier embodying the present invention characterized as forming color images by using a liquid crystal panel to form a latent image on a photosensitive sheet. Its structure is identical to that of the copier shown in FIG. 1 except the optical system. In FIG. 8, the photosensitive sheet mounted to the supporting roller 1a is of a type capable of forming a full-color image and comprises a base sheet of polyester or the like with one surface coated with microcapsules of the following three types uniformly dispersed thereon: (1) those containing a light-curable agent sensitive to light in a blue wavelength range and a colorless dye which chromogenically turns yellow (=yellow capsules), (2) those containing a light-curable agent sensitive to light in a green wavelength range and a colorless dye which chromogenically turns magenta (=magenta capsules), and (3) those containing a light-curable agent sensitive to light in a red wavelength range and a colorless dye which chromogenically turns cyanic (=cyanic capsules).

Opposite and distal from the supporting roller 1a inside the copier housing structure is an optical system comprised of an image forming exposure section nearly at the center of the housing structure in the forward-backward direction thereof and an image writing section disposed behind the image forming exposure section. FIG. 9 shows a part of the optical system and FIG. 10 shows the image writing section. In the image writing section, an image is written into a light-transmissive liquid crystal panel 40 disposed opposite across from the photosensitive sheet pulled out of the support roller 1a. The panel 40 into which an image has thus been written is then exposed to light at the image forming exposure section and transmitted light therethrough is directed to the photosensitive sheet to form an image thereon.

The image writing section includes a laser diode 41, a collimator lens 42, a galvano-mirror 43 and a focusing lens 44 with which an image is written in the liquid crystal panel 40. The laser diode 43 is controlled by a control means (not shown) to project laser heat onto the liquid crystal panel 40 through the collimator lens 42, the galvano-mirror 43 and the focusing lens 44. The liquid crystal panel 40 comprises, for example, a smectic liquid crystal cell having three image forming surfaces 40a, 40b and 40c which are formed at a specified angle θ from the center line A (of FIG. 4) of transportation for the photosensitive sheet and within a plane parallel thereto. The liquid crystal panel 40 can be moved in the directions of arrows L and M shown in FIG. 10 by means of a linear motor and an encoder (not shown). The galvano-mirror 43 is rotatable as indicated by arrows L' and M'.

A method of writing an image into the liquid crystal panel 40 is described next. As described above, the liquid crystal panel 40 can be moved along L or M such that one of the image forming surfaces 40a, 40b and 40c can be selectably positioned in the path of the laser heat from the laser diode 41. The aforementioned control means for the laser diode 43 is adapted to output a color image forming signal according to which the laser diode 43 emit laser heat. The color image forming signal is obtained by decomposing full-color image data into yellow, magenta and cyanic components. Data received through an image scanner, for example, may be analyzed to be used. If the image forming surface 40a happens to be in the optical path, laser heat is projected according to the yellow image data, if the image forming surface 40b is set in the optical path, laser heat is projected according to the magenta image data, and if the image forming surface 40c is set in the optical path, laser heat is projected according to the cyanic image data. As a result, images corresponding to yellow, magenta and cyanic are formed on the image forming surfaces 40a, 40b and 40c, respectively. Writing by laser heat is effected by point scanning by rotating the galvano-mirror 43 and shifting the liquid crystal panel 40. For example, if the galvano-mirror 43 is rotated in the direction of the arrow M' while the liquid crystal panel 40 is shifted in the direction of the arrow M, it is possible to form on an image forming surface 40a (40b or 40c)

tilted by a specified angle θ from the center line A of transportation for the photosensitive sheet an image at an angle θ with respect to the same center line A. Thus, a difference in transmissivity appears among the image forming surfaces 40a, 40b and 40c due to the exposure to laser heat and individual images with contrast are written in. Although an example has been described above wherein images are written on image forming surfaces which are already tilted with respect to the center line A of transportation for the photosensitive sheet, this is not intended to limit the scope of the present invention. These image forming surfaces may be tilted after images are written thereon.

As shown in FIG. 8, the image forming exposure section is comprised of a light source 51, a condenser lens 52, a shutter 53, a filter 54 and a focusing lens 55 such that light from the light source 51 is projected onto the photosensitive sheet through the condenser lens 52, the shutter 53, the liquid crystal panel 40, the filter 54 and the focusing lens 55, thereby causing the image written in the liquid crystal panel 40 to be focused on the photosensitive sheet. The filter 54 is supported unistructurally with the liquid crystal panel 40 and can be moved along the arrows L and M together with the liquid crystal panel 40. The filter 54 has three selectively transparent surfaces 54a, 54b and 54c, a blue transmissive surface 54a has the characteristic of selectively transmitting blue light, a green transmissive surface 54b has that of selectively transmitting green light, and a red transmissive surface 54c has that of selectively transmitting red light.

As explained above, yellow, magenta and cyanic contrast images are formed respectively on the individual image forming surfaces 40a, 40b and 40c of the liquid crystal panel 40. Next, light through each of these image forming surfaces 40a, 40b and 40c having contrast images formed thereon is used to focus these contrast images on the photosensitive sheet to thereby selectively harden the microcapsules on the photosensitive sheet and to form a latent image with color data. This is done by first inserting the image forming surface 40a and the selectively transparent surface 54a into the optical path of the light source 51 and then by switching on the light source 51. This causes light transmitting through the contrast image having the yellow image data of the image forming surface 40a and the selectively transparent surface 54a to exposure the photosensitive sheet. Since this light includes only blue beams, only the yellow capsules on the photosensitive sheet are selectively hardened. Similarly, if the image forming surface 40b and the selectively transparent surface 54b are inserted into the optical path of the light source 51 and the light source 51 is switched on, the majenta capsules on the photosensitive sheet are selectively hardened. If image forming surface 40c and the selectively transparent surface 54c are inserted into the optical path of the light source 51 and the light source 51 is switched on, the cyanic capsules on the photosensitive sheet are selectively hardened. Thus, yellow, magenta and cyanic capsules are hardened to form a latent image. Since the image forming surfaces 40a, 40b and 40c are all tilted by the specified angle θ from the direction of transportation of the photosensitive sheet, the latent image is also formed tilted by the same specified angle with respect to the direction of its transportation.

The latent image thus formed on the photosensitive sheet at an angle with the direction of its motion is matchingly superposed by an image transfer sheet, as explained above with reference to another embodiment of the present invention, transported in a tilted condition by the timing rollers 6b and thereafter transported into the gap between the pressure rollers 31 and 32 of the compression device 3. The pressure rollers 31 and 32 compress the photosensitive sheet and the image transfer sheet together to rupture unhardened microcapsules. The colorless dyes encapsulated in the ruptured microcapsules react chromogenically with the developing agent on the image transfer sheet to form a color image thereon. After heated by the heat roller 7, the image transfer sheet is discharged onto the discharge tray 8 by means of the discharge rollers 8a.

With an image forming apparatus thus structured, images were formed by varying the angle θ of the image transfer sheet transported to the pressure rollers 31 and 32. The angle θ was varied by changing the angle of the timing rollers 6b. The angle of the latent image formed on the photosensitive sheet was varied by changing the angles of the image forming surfaces 40a, 40b and 40c of the liquid crystal panel 40 and the angle of rotation of the galvano-mirror 43. The changes thus obtained in the current through the motor for driving the pressure rollers 31 and 32 were similar to the results shown in FIG. 5.

The foregoing description of preferred embodiments of the invention has been presented for purposes of illustration and description. It is not intended to be exhaustive or to limit the invention to the precise form disclosed, and many modifications and variations are possible in light of the above teaching. For example, although transmitted light passing through the liquid crystal panel 40 was focused on the photosensitive sheet according to the illustrative example above, use may be made of light reflected by the liquid crystal panel to focus on the photosensitive sheet. Any such modifications and variations that may be apparent to a person skilled in the art are intended to be included within the scope of this invention.

What is claimed is:

1. In an image forming apparatus adapted to form an image by superposing an image transfer sheet over a photosensitive sheet, said photosensitive sheet having a surface thereof coated with microcapsules encapsulating a light-curable agent and a colorless dye and said image transfer sheet having one surface thereof coated with a developing agent having an chromogenic effect on said colorless dye, and by rupturing unhardened ones of said microcapsules by compressing said photosensitive sheet and said image transfer sheet superposingly together between a pair of pressure rollers, the improvement wherein said image forming apparatus comprising means for transporting said image transfer sheet to said pressure rollers by tilting said image transfer sheet by a tilting angle greater than 0.5° from the axes of said pressure rollers.

2. The image forming apparatus of claim 1 further comprising timing rollers serving to transport said image transfer sheet to said pressure rollers, said transporting means serving to stop said image transfer sheet temporarily at said timing rollers before said timing rollers operate to transport said image transfer sheet to said pressure rollers.

3. The image forming apparatus of claim 2 wherein the axial direction of said timing rollers is tilted by a specified angle from the axial direction of said pressure rollers.

4. The image forming apparatus of claim 1 further comprising an optical system for forming an image on said photosensitive sheet by tilting said image by said tilting angle.

5. The image forming apparatus of claim 4 wherein said optical system serves to focus on said photosensitive sheet an original image written in a cell which allows writing therein by electric-thremo-optical effects of laser heating.

6. The image forming apparatus of claim 5 further comprising means for writing an image in said cell by laser heating.

7. The image forming apparatus of claim 5 wherein said cell includes a smectic liquid crystal panel.

* * * * *